United States Patent
Xiao et al.

(10) Patent No.: US 9,219,320 B2
(45) Date of Patent: Dec. 22, 2015

(54) FOOLPROOF STRUCTURE FOR SHARING CARD SLOT SPACE

(71) Applicant: Huawei Device Co., LTD, Shenzhen (CN)

(72) Inventors: Jianjun Xiao, Shenzhen (CN); Menglong Zhao, Shenzhen (CN); Jun Liu, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 0 days.

(21) Appl. No.: 14/495,361

(22) Filed: Sep. 24, 2014

(65) Prior Publication Data

US 2015/0011129 A1    Jan. 8, 2015

Related U.S. Application Data

(63) Continuation of application No. PCT/CN2013/074479, filed on Apr. 20, 2013.

(30) Foreign Application Priority Data

Apr. 20, 2012    (CN) .......................... 2012 1 0118581

(51) Int. Cl.
| | |
|---|---|
| H01R 12/72 | (2011.01) |
| G06K 7/00 | (2006.01) |
| H04B 1/3816 | (2015.01) |
| H01R 27/02 | (2006.01) |
| H04M 1/02 | (2006.01) |
| H05K 5/02 | (2006.01) |

(52) U.S. Cl.
CPC ............ *H01R 12/721* (2013.01); *G06K 7/0013* (2013.01); *H01R 27/02* (2013.01); *H04B 1/3816* (2013.01); *H04M 1/02* (2013.01); *H05K 5/0286* (2013.01)

(58) Field of Classification Search
CPC . H01R 12/721; H05K 5/0286; H05K 5/0291; H04B 1/3816; G06K 7/0013
See application file for complete search history.

(56) References Cited

U.S. PATENT DOCUMENTS

| | | | | |
|---|---|---|---|---|
| 5,894,597 A | * | 4/1999 | Schwartz | ............. G06K 7/0021 235/441 |
| 5,933,328 A | * | 8/1999 | Wallace | ............. G06K 13/0862 257/678 |
| 6,062,887 A | * | 5/2000 | Schuster | ............. G06K 7/0021 439/218 |

(Continued)

FOREIGN PATENT DOCUMENTS

| | | |
|---|---|---|
| CN | 1375974 A | 10/2002 |
| CN | 2547031 Y | 4/2003 |

(Continued)

*Primary Examiner* — Ross Gushi
(74) *Attorney, Agent, or Firm* — Slater & Matsil, L.L.P.

(57) ABSTRACT

The present invention discloses a structure for sharing card slot space. The structure includes a housing. A first card slot and a second card slot are disposed inside the housing. The insertion port of the first card slot is disposed opposite the insertion port of the second card slot. A common space is disposed between the first card slot and the second card slot. A groove is disposed inside the housing of the common space. A stopper is disposed inside the groove. The stopper can slide in the groove between the first card slot and the second card slot and is configured to prevent a card corresponding to the second card slot from being inserted into the first card slot or to prevent a card corresponding to the first card slot from being inserted into the second card slot.

18 Claims, 7 Drawing Sheets

(56) References Cited

U.S. PATENT DOCUMENTS

| | | | | |
|---|---|---|---|---|
| 6,101,372 | A * | 8/2000 | Kubo | H04B 1/3816 439/354 |
| 6,175,505 | B1 * | 1/2001 | Cheng | G06K 7/0021 361/737 |
| 6,220,882 | B1 * | 4/2001 | Simmel | G06K 7/0021 439/326 |
| 6,226,189 | B1 * | 5/2001 | Haffenden | G06K 7/0021 235/492 |
| 6,275,383 | B1 | 8/2001 | Bohm | |
| 6,424,118 | B1 * | 7/2002 | Tu | G06K 7/0034 320/114 |
| 6,455,188 | B1 * | 9/2002 | McKay | H01M 2/1066 429/100 |
| 6,563,715 | B2 * | 5/2003 | Villain | G06K 7/0021 174/368 |
| 6,761,591 | B1 * | 7/2004 | Zhou | G06K 13/08 439/630 |
| 6,766,952 | B2 * | 7/2004 | Luu | G06K 7/0034 235/451 |
| 6,888,724 | B2 * | 5/2005 | Shaie | H05K 5/0273 235/382 |
| 6,892,078 | B2 * | 5/2005 | Sakaguchi | H04B 1/3816 379/433.09 |
| 6,947,767 | B2 * | 9/2005 | Haga | G06K 7/0021 361/726 |
| 6,969,282 | B2 * | 11/2005 | Liu | H04B 1/3816 235/441 |
| 7,093,764 | B1 * | 8/2006 | Valenzuela | G06K 7/0021 235/486 |
| 7,097,511 | B1 * | 8/2006 | Chen | H01R 12/7011 439/159 |
| 7,131,871 | B1 * | 11/2006 | Zuo | H04B 1/3816 439/299 |
| 7,149,307 | B2 * | 12/2006 | Puharinen | G06K 7/0013 379/433.09 |
| 7,160,131 | B1 * | 1/2007 | Zuo | H04B 1/3816 439/136 |
| 7,238,038 | B2 * | 7/2007 | Kumagai | H04B 1/3816 439/326 |
| 7,244,135 | B2 * | 7/2007 | Chen | H04B 1/3816 439/327 |
| 7,264,495 | B2 * | 9/2007 | Zuo | H04B 1/3816 439/326 |
| 7,280,846 | B2 * | 10/2007 | Lin | G06K 7/0021 379/433.09 |
| 7,306,491 | B1 * | 12/2007 | Wei | H01R 13/629 235/441 |
| 7,344,401 | B2 * | 3/2008 | Zuo | H01R 13/2442 439/326 |
| 7,354,290 | B2 * | 4/2008 | Zhan | H01R 13/2478 439/326 |
| 7,371,088 | B2 * | 5/2008 | Chen | G06K 13/085 439/159 |
| 7,407,414 | B2 * | 8/2008 | Zuo | H01R 13/629 439/630 |
| 7,445,510 | B2 * | 11/2008 | Feng | H01R 12/7058 439/630 |
| 7,447,522 | B2 * | 11/2008 | Kumazawa | G06K 7/0021 361/814 |
| 7,458,857 | B2 * | 12/2008 | Lin | H04B 1/3816 439/630 |
| 7,494,360 | B2 * | 2/2009 | Zhan | H04B 1/3816 439/326 |
| 7,634,297 | B2 * | 12/2009 | Sin | G06K 7/0034 455/550.1 |
| 7,672,691 | B2 * | 3/2010 | Kim | H04B 1/3816 455/558 |
| 7,744,000 | B2 * | 6/2010 | Yang | G06K 13/08 235/441 |
| 7,762,827 | B2 * | 7/2010 | Liu | H01R 13/639 439/331 |
| 7,762,850 | B2 * | 7/2010 | Tang | H04B 1/3816 439/630 |
| 7,775,836 | B2 * | 8/2010 | Lu | H04M 1/026 439/327 |
| 7,780,090 | B2 * | 8/2010 | Long | G06K 13/08 235/486 |
| 7,798,858 | B1 * | 9/2010 | Zuo | H04M 1/0202 439/326 |
| 7,823,790 | B1 * | 11/2010 | Valenzuela | G06K 7/0021 235/486 |
| 7,916,488 | B2 * | 3/2011 | Chang | H01R 13/639 361/737 |
| 8,059,419 | B2 * | 11/2011 | Lu | G06K 7/0021 361/759 |
| 8,107,258 | B2 * | 1/2012 | Chang | G06F 1/1658 361/759 |
| 8,154,878 | B2 * | 4/2012 | Wang | G06K 13/08 361/754 |
| 8,200,282 | B2 * | 6/2012 | Liang | H04B 1/3816 361/679.3 |
| 8,215,558 | B2 * | 7/2012 | Valenzuela | G06K 7/0021 235/380 |
| 8,233,949 | B2 * | 7/2012 | Li | G06K 7/0021 455/558 |
| 8,248,819 | B2 * | 8/2012 | Wang | H04B 1/3816 361/747 |
| 8,280,441 | B2 * | 10/2012 | Lo | H04B 1/3816 455/558 |
| 8,391,922 | B2 * | 3/2013 | Lee | H04B 1/3816 365/229 |
| 8,724,311 | B2 * | 5/2014 | Hsu | G06F 1/1601 165/104.33 |
| 8,737,088 | B2 * | 5/2014 | Chang | G06K 7/0039 361/737 |
| 8,746,573 | B2 * | 6/2014 | Zhu | H04B 1/3816 235/486 |
| 8,801,468 | B2 * | 8/2014 | Gao | G06K 13/0831 439/630 |
| 8,808,021 | B2 * | 8/2014 | Liu | H01R 12/774 439/331 |
| 8,824,130 | B2 * | 9/2014 | Chang | G06K 7/0039 235/441 |
| 8,824,153 | B2 * | 9/2014 | Chang | G06K 7/0039 361/737 |
| 8,925,825 | B2 * | 1/2015 | Phillips | G06K 19/07739 235/486 |
| 8,968,030 | B2 * | 3/2015 | Zhang | H05K 5/0286 439/630 |
| 9,048,557 | B2 * | 6/2015 | Kang | G06K 19/07732 |
| 9,065,204 | B2 * | 6/2015 | Wan | H01R 13/62 |
| 9,118,140 | B2 * | 8/2015 | Chang | H01R 13/46 |
| 2002/0036896 | A1 * | 3/2002 | Matsumoto | G06K 7/0013 361/752 |
| 2002/0094841 | A1 * | 7/2002 | Sakaguchi | H04B 1/3816 455/558 |
| 2002/0118826 | A1 * | 8/2002 | Kiernan | H04M 1/0262 379/433.09 |
| 2002/0132528 | A1 | 9/2002 | Harasawa et al. | |
| 2003/0195020 | A1 * | 10/2003 | Kubo | H04B 1/3816 455/575.1 |
| 2003/0227763 | A1 * | 12/2003 | Kao | H04B 1/3816 361/818 |
| 2005/0208814 | A1 * | 9/2005 | Tsai | H01R 4/5066 439/326 |
| 2005/0233763 | A1 | 10/2005 | Kim et al. | |
| 2005/0255753 | A1 * | 11/2005 | Buschmann | H04B 1/3816 439/630 |
| 2006/0030361 | A1 | 2/2006 | Sin | |
| 2006/0063402 | A1 | 3/2006 | Takagi | |
| 2006/0065729 | A1 * | 3/2006 | Miyairi | G06K 7/0013 235/441 |
| 2006/0144751 | A1 | 7/2006 | Tsang | |
| 2007/0001698 | A1 * | 1/2007 | Chen | H01R 33/97 439/630 |
| 2007/0021010 | A1 * | 1/2007 | Chen | H01R 12/7011 439/630 |
| 2007/0032122 | A1 * | 2/2007 | Wang | G06K 19/07732 439/374 |
| 2007/0060198 | A1 * | 3/2007 | Kuo | H04M 1/0202 455/558 |
| 2007/0087600 | A1 * | 4/2007 | Chen | G06K 7/0021 439/159 |

(56) References Cited

U.S. PATENT DOCUMENTS

| | | | |
|---|---|---|---|
| 2007/0128913 A1* | 6/2007 | Zuo | H01R 13/629 439/325 |
| 2007/0131777 A1* | 6/2007 | Yang | G06K 7/0013 235/486 |
| 2007/0141878 A1* | 6/2007 | Van der Steen | G06K 13/08 439/159 |
| 2007/0293092 A1* | 12/2007 | Seo | H04B 1/3816 439/630 |
| 2009/0269944 A1* | 10/2009 | Gao | G06K 13/08 439/59 |
| 2010/0033939 A1* | 2/2010 | Liu | H04M 1/03 361/759 |
| 2010/0087080 A1* | 4/2010 | Li | G06K 7/0021 439/327 |
| 2010/0093235 A1* | 4/2010 | Huang | H04B 1/3816 439/892 |
| 2010/0259906 A1* | 10/2010 | Chang | G06K 13/085 361/759 |
| 2010/0279552 A1* | 11/2010 | Zhu | G06K 7/0021 439/630 |
| 2011/0003499 A1 | 1/2011 | Sato et al. | |
| 2011/0034050 A1* | 2/2011 | Zhu | G06K 13/08 439/159 |
| 2011/0051391 A1* | 3/2011 | Wei | H05K 5/0269 361/818 |
| 2011/0070760 A1* | 3/2011 | Zhang | G06K 7/0021 439/159 |
| 2013/0115796 A1* | 5/2013 | Liu | G06K 7/0021 439/325 |
| 2014/0002971 A1* | 1/2014 | Chung | H05K 5/0286 361/679.01 |
| 2014/0038445 A1* | 2/2014 | Zhang | H05K 5/0286 439/345 |
| 2015/0004846 A1* | 1/2015 | Cao | G06K 13/08 439/631 |
| 2015/0011129 A1* | 1/2015 | Xiao | G06K 7/0013 439/630 |
| 2015/0034232 A1* | 2/2015 | Wang | G06K 19/07739 156/152 |
| 2015/0213354 A1* | 7/2015 | Wang | G06K 19/07739 235/492 |
| 2015/0214603 A1* | 7/2015 | Choi | H04B 1/3816 455/575.7 |

FOREIGN PATENT DOCUMENTS

| | | |
|---|---|---|
| CN | 2655461 Y | 11/2004 |
| CN | 2669231 Y | 1/2005 |
| CN | 2779490 Y | 5/2006 |
| CN | 2826738 Y | 10/2006 |
| CN | 200953411 Y | 9/2007 |
| CN | 100367304 C | 2/2008 |
| CN | 101312269 A | 11/2008 |
| CN | 100508408 C | 7/2009 |
| CN | 201556740 U | 8/2010 |
| CN | 102509979 A | 6/2012 |
| CN | 102655306 A | 9/2012 |
| EP | 1603073 A1 | 12/2005 |
| EP | 1626509 A1 | 2/2006 |
| JP | 2011014405 A | 1/2011 |

* cited by examiner

FOOLPROOF STRUCTURE FOR SHARING CARD SLOT SPACE

This application is a continuation of International Application No. PCT/CN2013/074479, filed on Apr. 20, 2013, which claims priority to Chinese Patent Application No. 201210118581.X, filed on Apr. 20, 2012, both of which are hereby incorporated by reference in their entireties.

TECHNICAL FIELD

The present invention relates to the field of communications and, in particular embodiments, to a foolproof structure for sharing card slot space.

BACKGROUND

Many communications terminal products need to use two cards: a subscriber identity module (SIM) card and a secure digital memory card (SD) card. The SIM card and SD card are placed in card slots. According to product layout requirements, the card slots of the two cards are independent of each other. That is, there is a SIM card slot and an SD card slot that are separately disposed.

SUMMARY

During the implementation of the present invention, the inventor finds that the prior art has at least the following problems. Two cards cannot share card slot space. Otherwise, motion interference occurs when a card is inserted or removed and a risk of inserting a card into a wrong card slot arises. In addition, sometimes product size and layout requirements cannot be met.

For the foregoing deficiency in the prior art, embodiments of the present invention provide a foolproof structure for sharing card slot space to avoid interference and wrong card slot insertion, to increase product space utilization, and to reduce a product size.

To implement the foregoing purpose, technical solutions adopted in the present invention are as follows. A foolproof structure for sharing card slot space includes a housing. A first card slot and a second card slot are disposed inside the housing. An insertion port of the first card slot is disposed opposite an insertion port of the second card slot, common space is disposed between the first card slot and the second card slot. A groove is disposed inside the housing of the common space, a stopper is disposed inside the groove. The stopper can slide in the groove between the first card slot and the second card slot and is configured to prevent a card corresponding to the second card slot from being inserted into the first card slot or to prevent a card corresponding to the first card slot from being inserted into the second card slot.

The technical solutions provided in the embodiments of the present invention bring the following beneficial effects. By disposing a stopper in common space between two card slots, the technical solution solves problems of wrong card insertion and a card moving back to another card slot when the card is being removed, increases product space utilization, and saves space, thereby reducing a size of a product that has two card slots.

Figure 1:
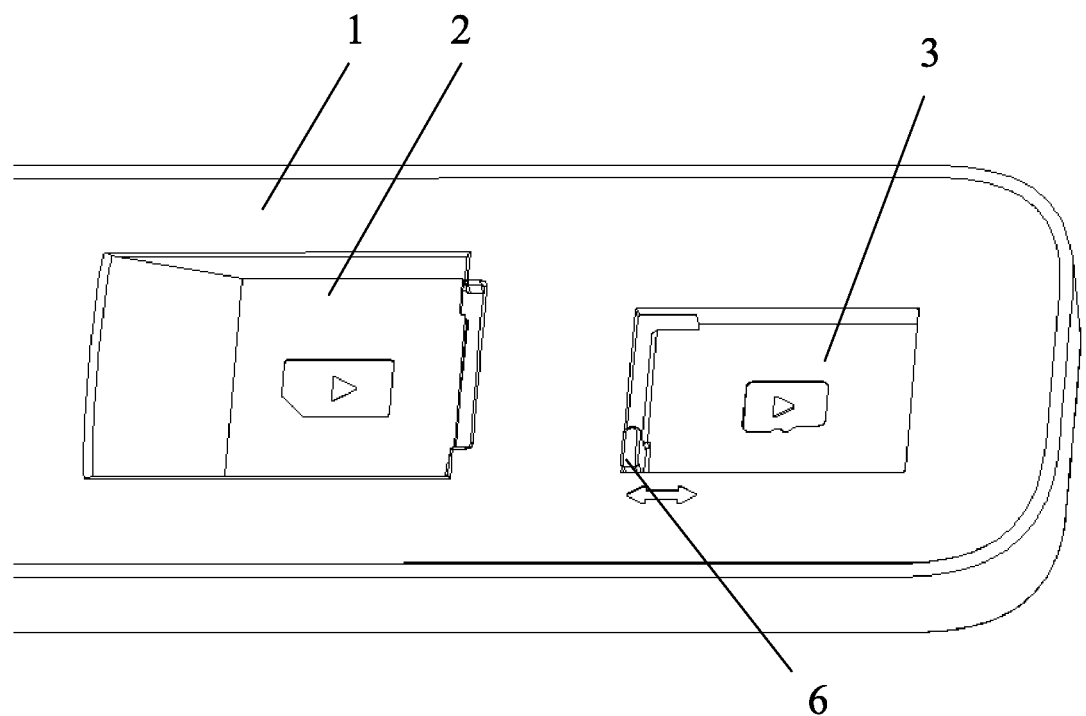
FIG. 1 is a schematic diagram of a status of a foolproof structure for sharing card slot space according to an embodiment of the present invention.

The following reference numbers are used in the figures:
1: housing
2: first card slot
3: second card slot
4: common space
5: groove
50: bump
51: upper surface
52: lateral surface
53: column
6: stopper
60: sliding part
61: stopping part
610: step
611: upper step part
612: lower step part
62: dimple
63: boss
7: SIM card
8: SD card
9: fastening block
90: hole
10: gap

DETAILED DESCRIPTION OF ILLUSTRATIVE EMBODIMENTS

To make the technical solutions and advantages of the present invention clearer, the following further describes the embodiments of the present invention in detail with reference to accompanying drawings.

Referring to FIG. 1, a foolproof structure for sharing card slot space includes a housing 1. A first card slot 2 and a second card slot 3 are disposed inside the housing 1. An insertion port of the first card slot 2 is disposed opposite an insertion port of the second card slot 3. Common space 4 (referring to FIG. 2) is disposed between the first card slot 2 and the second card slot 3. A groove 5 (referring to FIG. 5) is disposed inside the housing of the common space 4. A stopper 6 is dispose inside the groove 5. The stopper 6 can slide in the groove 5 between the first card slot 2 and the second card slot 3 and is configured to prevent a card corresponding to the second card slot 3 from being inserted into the first card slot 2 or to prevent a card corresponding to the first card slot 2 from being inserted into the second card slot 3.

In this embodiment of the present invention, a moving stopper is added in common space between two card slots. The stopper is used to prevent wrong card insertion and a card from moving back to another card slot when the card is being removed, and to increase space utilization and reduce a size of a product.

Referring to FIG. 1, this embodiment is based on the foregoing embodiment. A longitudinal length of the insertion port of the first card slot 2 is greater than a longitudinal length of the insertion port of the second card slot 3. The stopper 6 is configured to prevent the card corresponding to the second card slot 3 from being inserted into the first card slot 2.

In this embodiment of the present invention, a stopper is disposed between a first card slot and a second card slot to prevent a smaller card of the second card slot from being inserted into the first card slot into which a larger card can be inserted. In a case in which no card is inserted into the first card slot, the stopper is close to the insertion port of the first card slot, thereby preventing a card corresponding to the second card slot from being inserted into the first card slot. After a card is inserted into the second card slot, the stopper slides to an end that is close to the insertion port of the second card slot, thereby allowing common space to be used for inserting a card into the first card slot. In this embodiment, space utilization is increased, wrong card insertion is prevented, and a card is prevented from moving back to another card slot when the card is being removed.

Figure 2:
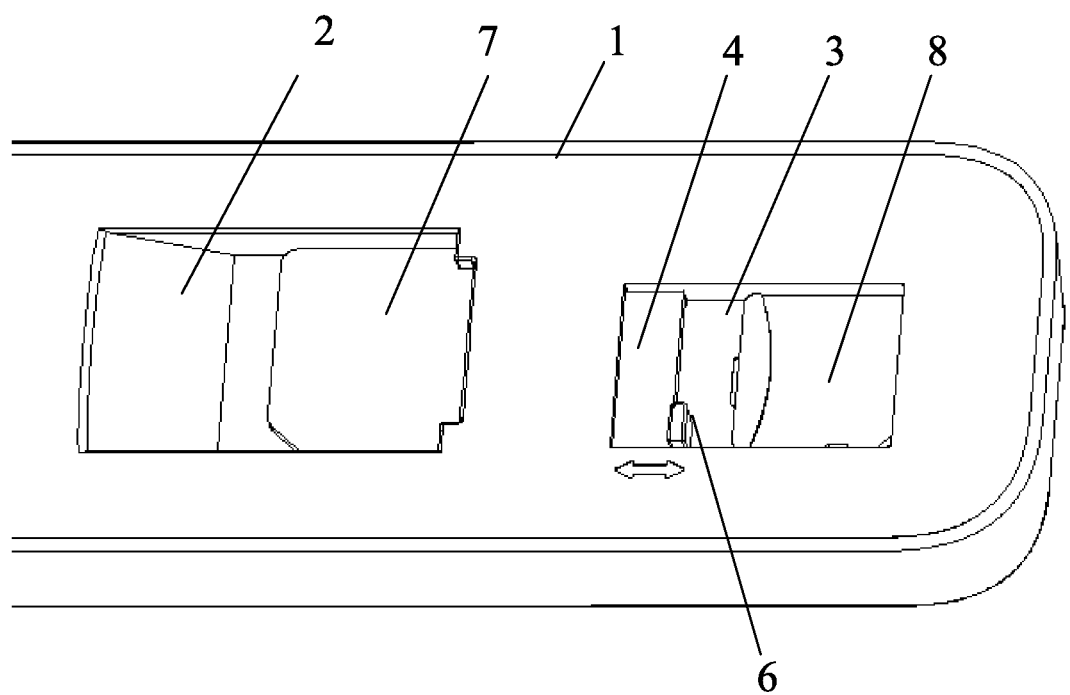
FIG. 2 is a schematic diagram of another status of a foolproof structure for sharing card slot space according to an embodiment of the present invention.

Referring to FIG. 2, preferably, the first card slot 2 is configured to be inserted with a SIM card 7, and the second card slot 3 is configured to be inserted with an SD card 8.

This embodiment of the present invention is also applicable to a case in which a SIM card and an SD card are used at the same time. In the foolproof structure according to this embodiment of the present invention, a moving stopper is disposed in common space between a SIM card and an SD card. The stopper may move in a SIM card area and an SD card area whose ranges are limited. When the SIM card or the SD card requires space for moving, the stopper may move to the area of the other card. For example, when the SD card is inserted, the moving stopper is located in the SIM card area to prevent the user from mistakenly inserting the SD card into a SIM card slot. When the SIM card is inserted, the stopper is pushed to a position that is close to the SD card, which does not affect the insertion of the SIM card. When the user removes the SD card, the stopper may be pushed together with the SD card to a position that is close to the SIM card to prevent the SD card from moving back to the card slot of the SIM card.

Figure 3:
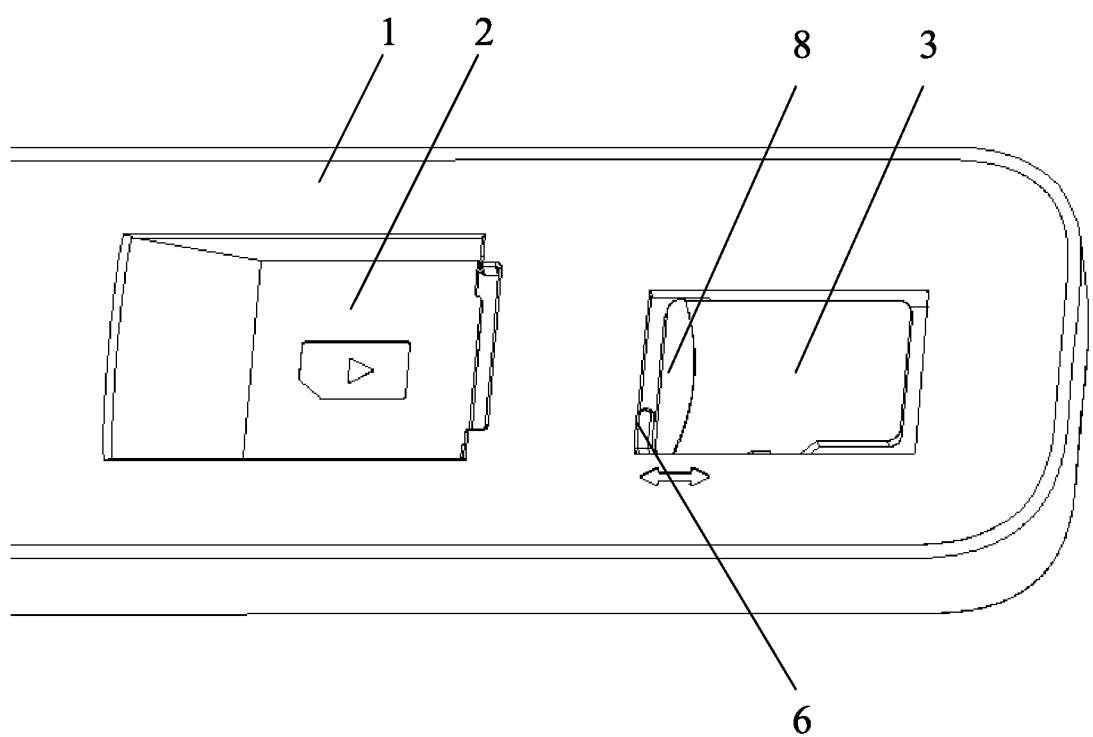
FIG. 3 is a schematic structural diagram of a SD card removing status of a foolproof structure for sharing card slot space according to an embodiment of the present invention.

When the SIM card 7 and the SD card 8 are not inserted in a product of the present invention, the stopper is located in a first fastened position shown in FIG. 1. In this case, the stopper 6 blocks the SIM card slot (the first card slot 2) and the user cannot mistakenly insert the SD card 8 into the slot of the SIM card 7. After the SD card is inserted into the second card slot 3, the stopper 6 remains in the original position. In this case, the SIM card 7 is inserted into the first card slot 2. When the SIM card 7 is inserted, the stopper 6 moves with the SIM card 7 at the same time in a direction opposite the direction in which the SIM card moves (the SIM card pushes the stopper to move with it). The stopper is in a second fastened position shown in FIG. 2 when the SIM card is completely inserted. When the user first removes the SIM card 7 and then the SD card 8, the stopper 6 moves with the SD card 8, moves back to a fastened position shown in FIG. 3, and stops the SD card 8 from further moving to prevent the SD card 8 from moving back to the SIM card slot due to moving back over an excessively long distance.

Figure 4:
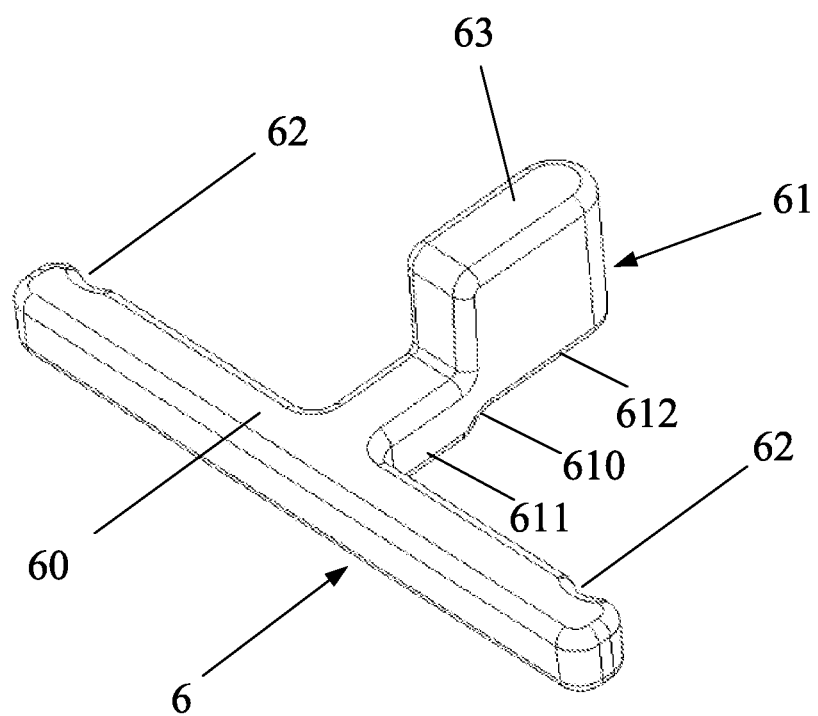
FIG. 4 is a schematic structural diagram of a stopper according to an embodiment of the present invention.
Figure 5:
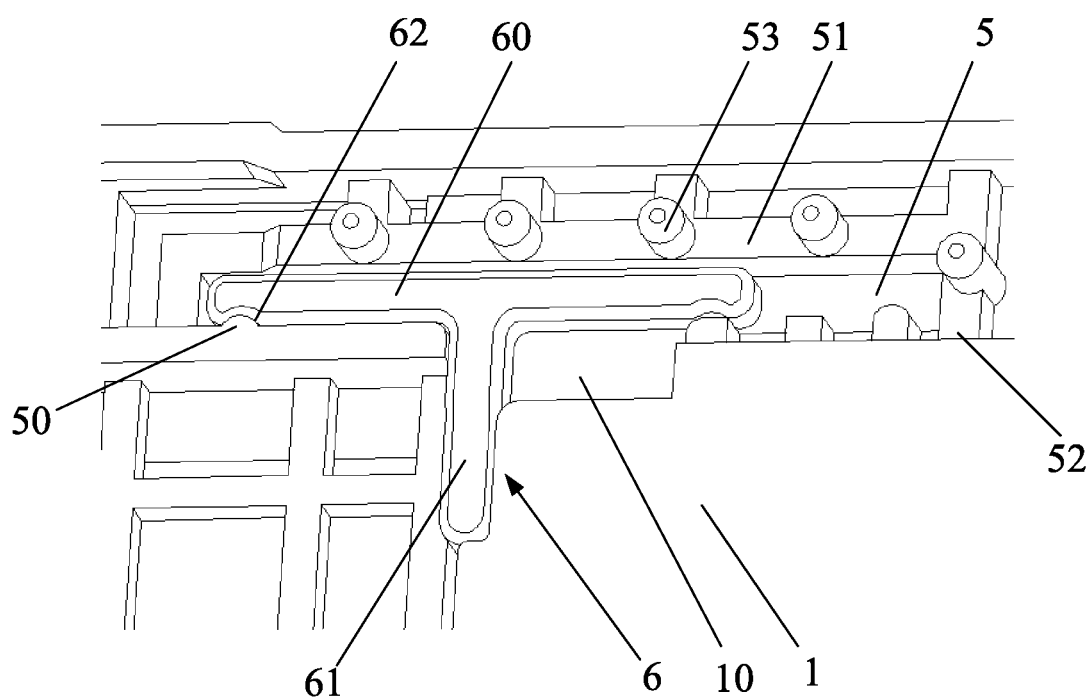
FIG. 5 is a schematic diagram of a status of coordination between a stopper and a groove according to an embodiment of the present invention.
Figure 6:
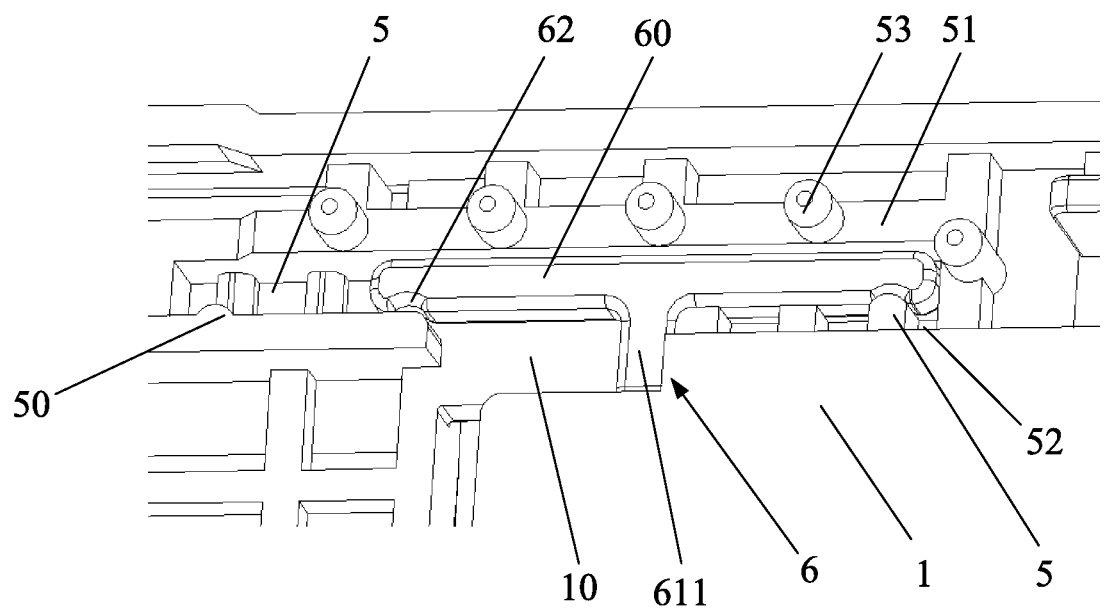
FIG. 6 is a schematic diagram of another status of coordination between a stopper and a groove according to an embodiment of the present invention.

Referring to FIG. 4 and FIG. 5, the stopper 6 includes a sliding part 60 and a stopping part 61. The sliding part 60 is disposed in the groove 5, and the stopping part 61 is connected to the sliding part 60. In this embodiment of the present invention, the sliding part is configured to push the stopping part to move, thereby implementing a phenomenon that the stopper prevents wrong card insertion and prevents a card from moving back to another card slot when being removed.

Referring to FIG. 4 and FIG. 5, preferably, the sliding part 60 and stopping part 61 form a T shape. Two dimples 62 are disposed with a spacing on an upper side wall of the sliding part 60, and two bumps 50 coordinating with the dimples 62 are disposed at a spacing of a side wall of the groove 5.

In this embodiment of the present invention, two fastening bumps are disposed on a side wall of a sliding part of a stopper and coordinate with fastening dimples on a groove of a housing. When sliding, the stopper slides from a positioning point to the other positioning point. These two positioning points correspond to two working positions of the stopper. A lateral distance between the two positioning points is a lateral distance of common space. In the present invention, dumps and dimples that coordinate with each other are disposed, thereby locking the positions for fastening the stopper. Force of coordination between the bumps and dimples for fastening the stopper is very small. The coordination between the bumps and dimples prevents the stopper from shaking and making abnormal sounds when a product is shaken. Force of inserting a card may easily push the stopper out of a fastening point, and then the stopper moves with the inserted card. It is the shape of the groove side wall housing that limits the movement range of the stopper. The stopper may also be in baffle plate form.

Referring to FIG. 4, there is a boss 63 extended in a vertical direction of the stopping part 61.

In this embodiment of the present invention, a boss is disposed at the rear end of a stopping part to prevent a phenomenon of wrong card insertion. The disposed boss can enable a groove and a sliding part of the present invention to be placed at the edge of a product, which is conducive to the position layout of the product.

Referring to FIG. 4, FIG. 5, FIG. 6, and FIG. 7, a step 610 is disposed on the stopping part 61 on another side opposite the boss 63, the step 610 divides the stopping part 61 into an upper step part 611 and a lower step part 612, and a gap 10 is disposed on the housing 1 at a position corresponding to the upper step part 611.

A step is disposed on the surface of a stopping part and a gap is disposed on a housing, so that an upper step part does not come into contact with the housing when a stopper slides, which facilitates sliding. The design of the step enables a lower step part to keep a distance from the housing and to slide without being limited by the housing. A housing is disposed corresponding to the top of the lower step part, which prevents the collapse of the entire stopping part and a stopper failure when a boss is pressed.

Preferably, one dimple 62 is located on a side wall of the sliding part 60 on one side of the stopping part 61, and the other dimple 62 is located on the side wall of the sliding part 60 on the other side of stopping part 61.

When the stopper 6 is located on one positioning point, the dimple 62 on a side of the stopping part 61 coordinates with one bump 50 (referring to FIG. 4) to fasten the stopper 6. When the stopper 6 leaves the positioning point and slides to the other positioning point, the dimple 62 on the other side of the stopping part 61 coordinates with one bump 50 (referring to FIG. 6) to fasten the stopper again.

Figure 7:
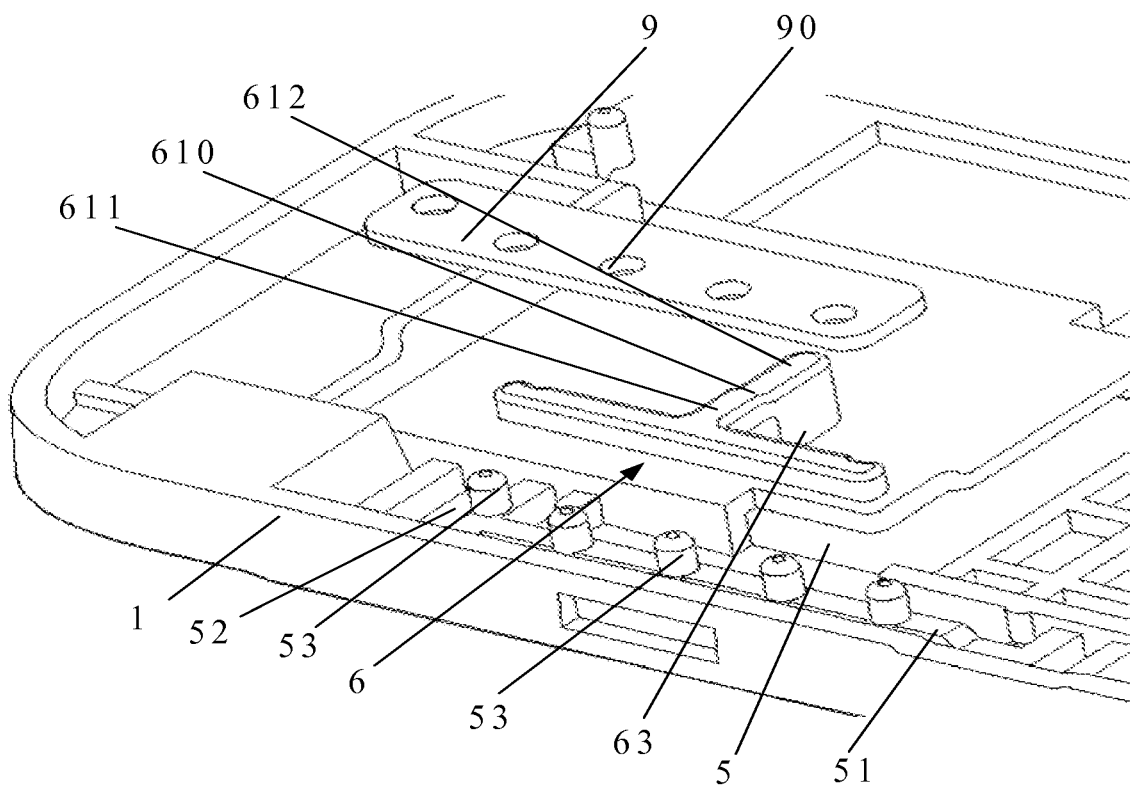
FIG. 7 is a schematic structural diagram of a fastening block that is fastened on the top of a stopper according to an embodiment of the present invention.

Referring to FIG. 7, more than one column 53 is disposed on an upper surface 51 on a side wall of the groove 5, holes 90 coordinating with the columns 53 are disposed on a fastening block 9, the columns 53 are inserted into corresponding holes 90, and the fastening block 9 is fastened on the groove 5 after the columns 53 are hot melt.

Preferably, four columns 53 in parallel are disposed on the upper surface 51, and one column 53 is disposed on a lateral surface 52 that is perpendicular to the upper surface 51. Accordingly, four holes in parallel are disposed on one side of the fastening block 9 and one hole is disposed on the other side.

Columns that are disposed on an upper surface and a lateral surface coordinate with holes to fasten a fastening block, which makes the fastening of the fastening block more secure.

Referring to FIG. 7, the fastening block 9 is disposed on the top of the sliding part 60, and the fastening block is fastened on the groove 5. In the preferable fastening manner more than one column 51 is disposed on the top edge of a side wall of the groove 5, and holes 90 coordinating with the columns 51 are disposed on the fastening block 9. The columns 51 are inserted into corresponding holes 90, and the fastening block 9 is fastened on the groove 5 after the columns 53 are hot melt.

In this embodiment of the present invention, a groove is slotted on a plastic housing. A stopper is fastened on the groove of the plastic housing by using a fastening block. The stopper moves in the groove. One bump is disposed on each end of the groove to coordinate with the stopper, so that the stopper can be locked and fastened in the position. Accordingly, the stopper has two fastening positions. When a card is removed, a dimple moves away from a bump, which can easily unlock the self-lock of the stopper without affecting hand feeling of a user.

The stopper is made of a metal or plastic material, and may be made by using a technique such as metal stamping or powder metallurgy.

The working principle of the foolproof structure according to the present invention is: A stopper is configured to separate two card slots to prevent problems of wrong card insertion or a card moving back over an excessively long distance, and the stopper can move within a certain range. The moving stopper is configured to flexibly change a size of the movement space. When one of a SIM card and an SD card requires space, the stopper can move together with one card to let the other card make the required space for the card, thereby implementing the purpose of enabling a SIM card and an SD card to share card slot common space and bringing greater space compressibility for product layout.

In the present invention, the foolproof structure for sharing card slot space may implement card slot sharing of a SIM card and an SD card, save space, and reduce a size of a product. The foolproof structure may be applied to any two or more moving parts that share space.

The foregoing descriptions are merely exemplary embodiments of the present invention, but are not intended to limit the present invention. Any modification, equivalent replacement, and improvement made without departing from the spirit and principle of the present invention shall fall within the protection scope of the present invention.

What is claimed is:

1. A structure for sharing card slot space, the structure comprising:
   a housing;
   a first card slot and a second card slot disposed inside the housing, wherein an insertion port of the first card slot is disposed opposite an insertion port of the second card slot and a common space is disposed between the first card slot and the second card slot;
   a groove disposed inside the housing of the common space; and
   a stopper disposed inside the groove, wherein the stopper can slide in the groove between the first card slot and the second card slot and is configured to prevent a card corresponding to the second card slot from being inserted into the first card slot or to prevent a card corresponding to the first card slot from being inserted into the second card slot.

2. The structure according to claim 1, wherein a longitudinal length of the insertion port of the first card slot is longer than a longitudinal length of the insertion port of the second card slot.

3. The structure according to claim 2, wherein the stopper is configured to prevent the card corresponding to the second card slot from being inserted into the first card slot.

4. The structure according to claim 3, wherein the card corresponding to the first card slot is a subscriber identity module SIM card and the card corresponding to the second card slot is a secure digital memory card SD card.

5. The structure according to claim 1, wherein the stopper comprises a sliding part and a stopping part, the sliding part being disposed inside the groove and the stopping part being connected to the sliding part.

6. The structure according to claim 5, wherein the sliding part and the stopping part form a T shape.

7. The structure according to claim 6, wherein two dimples are disposed at a spacing of an upper side wall of the sliding part and wherein two bumps coordinating with the dimples are disposed at a spacing of a side wall of the groove.

8. The structure according to claim 7, further comprising a boss extended in a vertical direction of the stopping part.

9. The structure according to claim 8, further comprising a step disposed on the stopping part on a side opposite the boss, the step dividing the stopping part into an upper step part and a lower step part, and wherein a gap is disposed on the housing at a position corresponding to the upper step part.

10. The structure according to claim 7, wherein one dimple is located on a side wall of the sliding part on one side of the stopping part and the other dimple is located on the side wall of the sliding part on the other side of stopping part.

11. The structure according to claim 5, wherein a fastening block is disposed on the top of the sliding part, the fastening block being fastened to the groove.

12. The structure according to claim 11, wherein more than one column is disposed on an upper surface of a side wall of the groove, wherein holes coordinating with the columns are disposed on the fastening block, wherein the columns are inserted into corresponding holes, and wherein the fastening block is fastened on the groove after the columns are hot melt.

13. The structure according to claim 12, wherein four columns in parallel are disposed on the upper surface and wherein one column is disposed on a lateral surface that is perpendicular to the upper surface.

14. The structure according to claim 1, wherein the stopper is made of a metal material.

15. The structure according to claim 1, wherein the stopper is made of a plastic material.

16. The structure according to claim 1, wherein the card corresponding to the first card slot is a subscriber identity module SIM card.

17. The structure according to claim 16, wherein the card corresponding to the second card slot is a secure digital memory card SD card.

18. The structure according to claim 1, wherein the card corresponding to the second card slot is a secure digital memory card SD card.

* * * * *